United States Patent [19]

Gurtler et al.

[11] Patent Number: 4,547,256

[45] Date of Patent: Oct. 15, 1985

[54] METHOD FOR THERMALLY TREATING A SEMICONDUCTOR SUBSTRATE

[75] Inventors: Richard W. Gurtler, Mesa; Ronald N. Legge, Scottsdale; Israel A. Lesk, Phoenix, all of Ariz.

[73] Assignee: Motorola, Inc., Schaumburg, Ill.

[21] Appl. No.: 450,898

[22] Filed: Dec. 20, 1982

[51] Int. Cl.⁴ .............................................. C30B 1/04
[52] U.S. Cl. ................... 156/603; 156/617 R; 156/DIG. 80; 219/121 L
[58] Field of Search .......... 156/603, 617 R, DIG. 73, 156/DIG. 80, DIG. 88, DIG. 102; 219/121 L; 148/1.5, DIG. 3, 90; 436/18, 125; 29/576 T

[56] References Cited
U.S. PATENT DOCUMENTS

| | | | |
|---|---|---|---|
| 3,600,237 | 8/1971 | Davis et al. | 156/617 R |
| 4,196,041 | 4/1980 | Baghdadi et al. | 156/617 R |
| 4,348,580 | 9/1982 | Drexel | 148/189 |
| 4,410,392 | 10/1983 | Winter | 156/603 |
| 4,432,809 | 2/1984 | Chye | 432/18 |

OTHER PUBLICATIONS

Powell et al., Appl. Phys. Lett. 39, No. 2, 7/15/81.
Fulks et al., Appl. Phys. Lett. 39(8), 10/15/81.
Yep et al., Appl. Phys. Lett. 38(3), 2/1/81.
Material Research Society Symposia vol. 13, Laser—Solid Interactions and Transient Thermal Processing of Materials, ed. Narayan et al., pp. 369-374—Wilson et al., North-Holland, N.Y.
IBM Technical Disclosure Bulletin, v. 15, No. 6, 11/72, p. 1967.
Dietl et al., Crystals v. 5, p. 76, Springer-Verlag, N.Y., 1981.

Primary Examiner—Hiram H. Bernstein
Attorney, Agent, or Firm—John A. Fisher

[57] ABSTRACT

Apparatus and method are provided for thermally treating a semiconductor substrate. According to the method, the substrate is isothermally heated to an elevated temperature near the thermal treatment temperature and then is further heated to a higher temperature at which the thermal treatment occurs. Following the thermal treatment the substrate is isothermally cooled to a sufficiently low temperature to avoid thermally induced defects.

12 Claims, 6 Drawing Figures

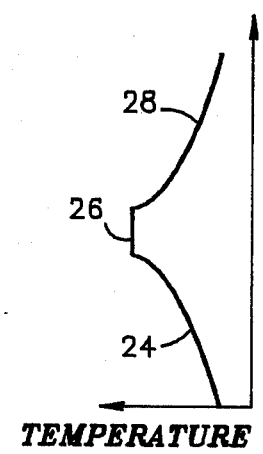
FIG. 1B
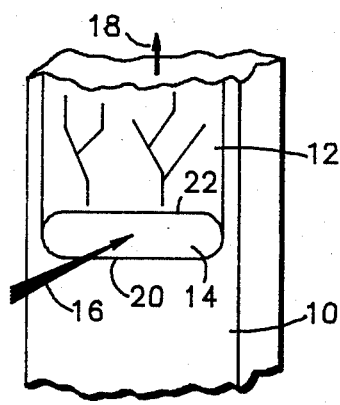
FIG. 1A
FIG. 3B
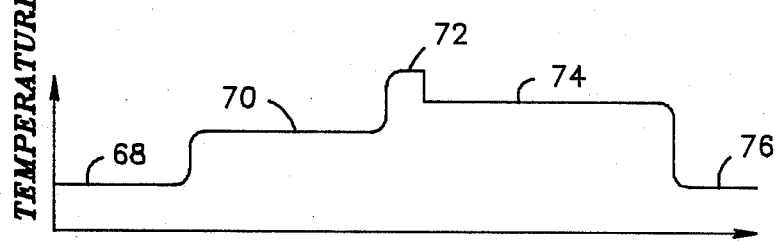
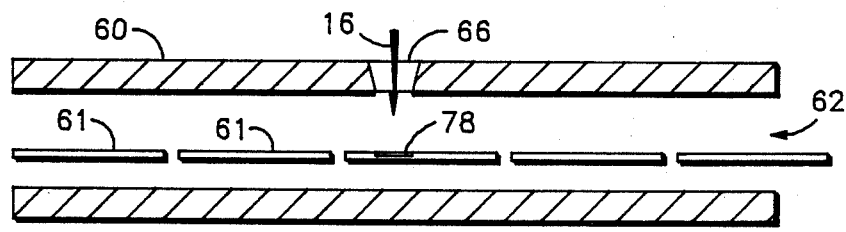
FIG. 3A

METHOD FOR THERMALLY TREATING A SEMICONDUCTOR SUBSTRATE

BACKGROUND OF THE INVENTION

This invention relates, in general, to an apparatus and method for thermally treating a semiconductor substrate, and more particularly to an apparatus and method for RTR recrystallization of semiconductor substrates.

In the manufacture of semiconductor devices such as transistors, integrated circuits, photovoltaic devices, and the like, the semiconductor industry uses large quantities of semiconductor material, usually silicon, in the form of thin wafers or sheets. It has been conventional to produce the semiconductor wafers by first growing a single crystal semiconductor ingot, sawing the ingot into a plurality of thin slices, and then lapping and polishing the slices to the desired thickness and surface finish. While this process has proved satisfactory for most semiconductor devices, it is too expensive for some large area semiconductor devices and especially for large area photovoltaic devices or solar cells. In fact, in order that photovoltaic devices become a viable alternative energy source, a significant reduction in the cost of the semiconductor starting material is essential.

One technique which has been proposed and developed for the production of thin sheets of semiconductor material suitable for the production of solar cells is the so-called ribbon-to-ribbon (RTR) conversion process. In this process a polycrystalline ribbon is transformed directly into a macrocrystalline ribbon without the need for costly processing of large diameter ingots. The RTR process uses one or more scanned beams of energy impinging on a polycrystalline ribbon to locally melt the ribbon and to induce crystal growth as the ribbon is translated past the energy beam. As the molten zone moves along the ribbon, the material behind the zone resolidifies in a macrocrystalline form. The macrocrystalline structure is one in which the crystals are of sufficiently large size to permit efficient semiconductor action. Therefore, a monocrystalline ribbon wherein the ribbon is but a single crystal is encompassed within the term "macrocrystalline." In this context, the word "ribbon" generally implies an elongate strip or sheet having a width much greater than its thickness. Typical dimensions might be a length of 15-30 cm, a width of 1-10 cm, and a thickness of 50-250 micrometers.

In the conventional RTR process the ribbon is preheated to a temperature approaching its melting temperature by moving the ribbon lengthwise through an increasing temperature. This, of course, imposes a temperature gradient along the ribbon from end to end. After melting, the ribbon again moves lengthwise, this time through a decreasing temperature. Imposing a temperature gradient along the ribbon tends to stress the ribbon resulting in bending, buckling, or shattering. The closer the temperature profile is to a linear profile, however, the less the stress. It is also believed that non-constant thermal gradients contribute significantly to the formation of dislocations which degrade minority carrier diffusion length and hence solar cell efficiency.

The need to raise the temperature of the ribbon to a temperature approaching its melting point and the deleterious effects of non-constant temperature gradient on ribbon morphology make the control of temperature gradient an important and difficult task in RTR recrystallization. The need to control temperature gradient has an adverse effect on equipment complexity and expense, on the quality of macrocrystalline ribbon produced, and on the speed and cost with which the ribbon can be produced.

While the effect of thermal gradients is important in RTR processing, the effect is also important in a host of other thermal treatments routinely encountered in semiconductor processing. Thermal gradient stressing is encountered, for example, in high temperature impurity diffusion into a semiconductor wafer. In that process a plurality of semiconductor wafers are typically loaded into a wafer holding boat and the boat is pushed into a furnace heated to 900° C. or more. In so heating the wafers, nonlinear temperature profiles are established because of a nonisotropic thermal environment caused by the proximity of adjacent wafers and the presence of the non-uniformly distributed thermal mass of the boat. The thermal stress induced by nonuniformly heating and cooling the wafers leads to the generation of dislocations and the reduction in minority carrier lifetime.

To produce improved devices, therefore, it is desirable to avoid defects induced while thermally treating a semiconductor substrate. Accordingly, it is an object of this invention to provide an improved process for thermally treating semiconductor substrates.

It is another object of this invention to provide an improved process for RTR recrystallization of semiconductor substrates.

It is another object of this invention to provide improved apparatus for thermally treating semiconductor substrates.

It is yet another object of this invention to provide an improved process to minimize thermally induced defects during a high temperature thermal treatment.

It is still another object of this invention to provide an improved process for rapid, high quality RTR processing of semiconductor substrates.

BRIEF SUMMARY OF THE INVENTION

The foregoing and other objects and advantages of the invention are achieved through use of an apparatus which allows isothermal temperature control of semiconductor substrates. Substrates are isothermally heated to an elevated temperature near the thermal treatment temperature, further heated to a still higher thermal treatment temperature, and then isothermally cooled to a lower temperature. There are a number of methods presented for isothermally heating and cooling the substrate. In one embodiment the isothermal heating is accomplished by rapidly scanning the surface of the entire substrate with an electron beam. The electron beam imparts energy to the surface of the substrate to uniformly heat the entire substrate. After thermal treatment, the substrate cools by radiation, but during the radiative cooling the temperature of the substrate is kept controlled and isothermal by controllably scanning the substrate surface with an electron beam.

BRIEF DESCRIPTION OF THE DRAWINGS

FIG. 1 illustrates the conventional RTR process;

FIG. 3 illustrates a further embodiment of apparatus for practice of the invention.

DETAILED DESCRIPTION OF PREFERRED EMBODIMENTS

Figure 2B:
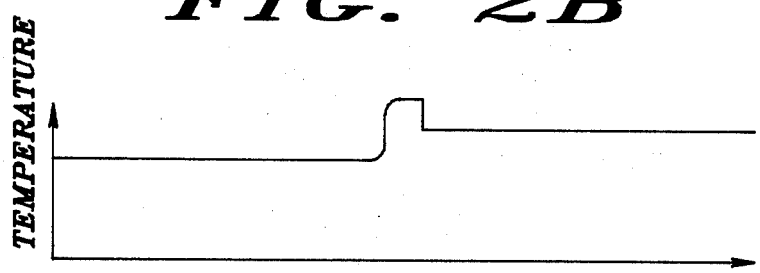
FIG. 2 illustrates apparatus for practice of the invention.

In the following the invention is illustrated by reference to specific embodiments and especially by reference to ribbon-to-ribbon conversion of silicon material. These embodiments are by way of example only; the invention is not to be construed as limited to these embodiments.

FIG. 1A illustrates the ribbon-to-ribbon (RTR) process as previously practiced in which a polycrystalline ribbon 10 is converted to a macrocrystalline ribbon 12. A molten zone 14 extending through the thickness of the ribbon is formed by a beam of energy 16 such as a laser beam, electron beam, or ion beam which impinges on the ribbon surface and is scanned across its width. The ribbon moves past the energy source 16 in a direction indicated by arrow 18. As the ribbon moves past the energy source, melting occurs at edge 20 (melting boundary) of the molten zone and resolidification with enhanced grain size occurs at edge 22 (freezing boundary) of the molten zone. With rigid edge RTR as illustrated, there is, of course, only a single (complex shape) solid-liquid surface.

FIG. 1B is a plot of the temperature profile experienced by the ribbon structure at a given instant during the process. The temperature profile includes a linear increasing temperature 24 to a temperature of about 1200° C., a temperature 26 in the molten zone of about 1410° C. and then a declining temperature 28 to a temperature of about 700° C. or less, below which little generation of thermally induced defects takes place. Along the length of the ribbon structure are imposed increasing and decreasing temperature profiles. To impose and control these temperature profiles is both costly and difficult. Further, the speed with which the RTR process can be carried out is limited by the speed with which the temperature profiles can be imposed and maintained on the ribbon structure.

In accordance with the invention, the high temperature thermal treatment of substrates, including the RTR recrystallization of semiconductor ribbons, is carried out by isothermally heating the semiconductor substrate to a temperature near the thermal treatment temperature and then isothermally cooling the substrate after the thermal treatment.

Figure 2A:
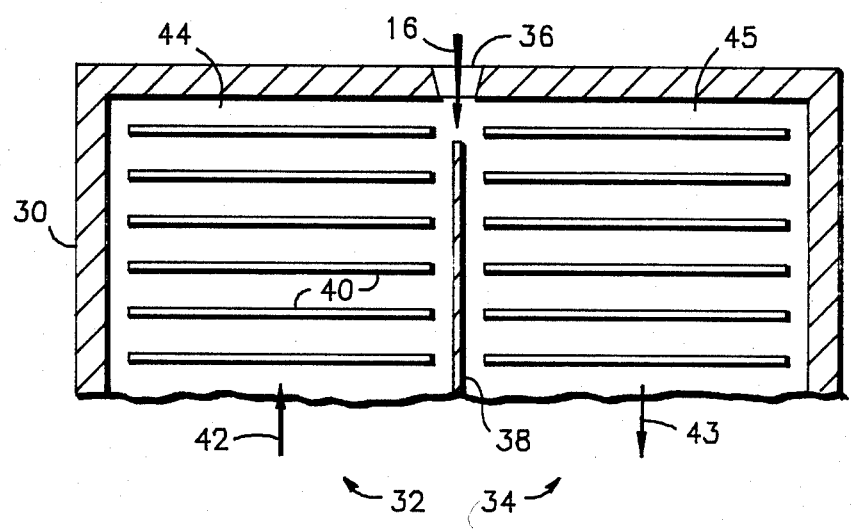

FIG. 2A illustrates one thermal treatment apparatus for carrying out the method in accordance with the invention. Again, for purposes of illustration but not limitation, apparatus suitable for RTR recrystallization is depicted. The apparatus, which is schematically illustrated, includes a furnace 30 and means (not shown) for controlling the ambient within the furnace. The furnace is divided into an input side 32 and an output side 34. The input side has a thermal profile with temperatures increasing from a relatively low temperature of, say, 700° C. at the bottom to an elevated temperature of about 1200° C. at the top. The output side has a temperature profile which decreases from near the melting point of silicon at the top to about 700° C. at the bottom. On each side the temperature can vary continuously or in discrete steps. The important feature is that the thermal contours in a horizontal direction be quite flat, i.e., vary by only a few degrees, and preferably by less than about 3° C.

A window 36, for example a quartz window or merely an opening in the furnace wall, permits an energy beam 16 to be directed into the interior of the furnace. The energy beam can be, for example, a laser beam, ion beam, or an electron beam. A thermally insulating divider 38 can be used to separate the portions of the furnace having increasing and decreasing temperature profiles, although such divider is not necessary if the two sides have identical profiles.

In operation, semiconductor substrates such as polycrystalline silicon ribbons are loaded into the input side 32 of the furnace. The loading may be accomplished through a gas interlock system or the like to maintain a controlled ambient within the furance. The substrates are preferably loaded into the furnace lying on thermally conductive carriers. The carriers can be constructed, for example, of pure silicon or carbon. The substrates and carriers 40 are positioned in the furnace in a horizontal position so that the major surfaces of the substrate are parallel to the isothermal contours in the furnace. The substrates and carriers are then moved through the furnace in the direction indicated by arrow 42 with the direction of motion essentially perpendicular to the broad surface of the substrates. The substrates are thus moved from the relatively low temperature input to the high temperature position indicated at 44 in such a manner that the only temperature gradient in the substrate is in the thickness direction. The substrate is thus essentially isothermal at all times as it moves through the temperature zones in the input side of the furnace. As a result, there is little or no temperature gradient along the substrate during heating to near the thermal treatment temperature.

The output side of the furnace is similarly designed so that substrates can be isothermally cooled from near the thermal treatment temperature to a relatively low temperature at the furnace output. Substrates can again be removed from the furnace through a gas interlock system to preserve control of the ambient within the furnace. During the cooling process, like the heating process, the substrates, which move in the direction indicated by arrow 43, are moved in a direction essentially perpendicular to their major surfaces with the major surfaces coinciding with isothermal temperature contours within the furnace so that the substrates are cooled from the thermal treatment temperature with little or no temperature gradient except in the thickness direction.

After isothermally heating to the furnace temperature at furnace position 44 the substrate is translated laterally through the thermal treatment which, in this embodiment, comprises localized melting by the energy beam 16. The substrate passes through the thermal treatment region to the location 45 and then is moved isothermally out of the furnace. The temperature profile experienced by the substrate as it moves laterally across the top of the furnace is indicated by the temperature profile illustrated in FIG. 2B. The temperature across the top of both the input and output sides is isothermal, although the temperature of the input and output sides is not necessarily identical. The only longitudinal temperature gradient experienced by the substrate is during the thermal treatment cycle. The substrate is maintained substantially isothermal both before and after the thermal treatment cycle.

FIG. 3A illustrates a further embodiment of the invention. Again, although the invention is broadly applicable to the thermal treatment of semiconductor substrates, for purposes of illustration, but not by way of limitation, the particular embodiment illustrated depicts the RTR recrystallization of silicon ribbons. Apparatus for practice of the invention includes a furnace 60 within which a desired temperature profile can be established. The apparatus further includes means (not shown) for controlling the ambient within the furnace. The ambient control means can include, for example, gas interlocks at the ends of the furnace and the like. Furnace 60 is provided with a window 66 such as a quartz window through which a melting energy beam 16 can be focused on ribbons passing therebeneath. A temperature profile as indicated in the graph of FIG. 3B is established in the furnace. The profile includes a relatively low temperature end zone 68, a high temperature isothermal zone 70 at a temperature of about 1200° C., a zone 72 of sufficiently high temperature to cause localized melting of the silicon ribbon, output isothermal zone 74 at a temperature below the melting zone 72 and a low temperature output zone 76. Melting zone 72 is established by a combination of the furnace temperature and the heat energy provided by energy beam 16.

In practice of the invention in accordance with this embodiment, polycrystalline ribbon substrates 61, which may be lying on thermally conductive carriers, are inserted in the input end 62 of furnace 60. The ribbon and carrier are first pushed into the low temperature zone 68 and then rapidly inserted into the isothermal high temperature zone 70. Rapidly pushing the carrier and ribbon into the isothermal zone 70, i.e., pushing the entire carrier into the zone in 1-2 seconds or less and utilizing a thermally conductive carrier somewhat larger than the size of the polycrystalline ribbon cause the polycrystalline ribbon to be heated in a substantially isothermal manner to the input furnace temperature of 1200° C.

After the ribbon is thus heated isothermally to 1200° C. the carrier and ribbon are further inserted into the furnace to pass under the melting energy beam 16. The melting beam melts a strip 78 across or almost across the ribbon, giving a temperature gradient sharp enough for rapid growth. The gradient may be further sharpened by leaving a gap (not shown) between the input heating area 70 and the output heating area 74. Adjustment of the gap, i.e., changing the thermal profiling in the neighborhood of the energy beam, is used to change the thermal gradient in and near molten zone 78. As the ribbon and carrier are further pushed into the furnace they pass into the isothermal output heating area and then are quickly i.e., in a time span of 1-2 seconds or less, removed from the high temperature zone 74.

The RTR process, in accordance with the invention, allows ribbon heating and cooling cycles to be carried out largely independent of the melting/recrystallization cycle. This enables separate control of ribbon cooling which influences bending and buckling of the ribbon and which also influences dislocation generation. The latter is dependent on the cooling of the ribbon occurring in the immediate post solidification region. Truly isothermal cooling results in no buckling of the ribbon. Rapid isothermal heating of the input ribbon makes the apparatus simple and straightforward and prevents any stress induced motion of the input ribbon.

Further, conditions close to the freezing boundary can be adjusted to reduce stress (and subsequent dislocation generation) consistent with rapid growth which in turn, is consistent with favorable economics and reduced dislocation generation. At rapid growth rates residual stress left after the recrystallization can be relieved without buckling by extending the period spent in the high temperature output heating zone. This zone can be made arbitrarily long by extending the length of the furnace.

Yet another embodiment of the invention is particularly attractive because of the ease with which it can be implemented. In this embodiment the substrate is positioned within an apparatus for controlling the ambient. Control of the temperature of the substrate is provided entirely, by electron beam heating. Scanning of the electron beam is easily controlled electronically. By so controlling the beam the ribbon can be quickly and isothermally heated to a desired temperature such as 1200° C. by quickly scanning the beam over the surface of the substrate. After isothermally heating the entire ribbon, the beam can additionally be used to locally melt a selected zone in accordance with standardized RTR. As the molten zone moves along the semiconductor substrate leaving a region of enhanced crystallinity in its path, the recrystallized region is allowed to isothermally cool by radiation to the surrounding ambient with the rate of cooling controlled by the continued scanning by the electron beam. The ribbon is thus isothermally heated by the scanning electron beam, locally melted by the same beam, and then isothermally cooled under the influence of the beam.

As an illustration of the use of the isothermal electron beam heating and cooling, a single crystal semiconductor wafer was isothermally heated from room temperature to 1200° C. and then cooled to room temperature, each in a period of about 5 seconds, without inducing any buckling or any thermally induced dislocations.

In a further embodiment, the isothermal heating and cooling can be achieved, for example, through the use of either fast acting radiant heating lamps or low thermal mass heaters. With either of these heater types the substrate is placed in the apparatus at a low temperature, such as room temperature, and the heater is energized to isothermally heat the substrate to the high, pre-heat treatment temperature. The substrate is moved through a heat treatment region of the apparatus to a post-heat treatment region which is isothermally heated to a preselected high temperature by a similar heater type. The substrate is isothermally cooled, rapidly if desired, to a lower temperature under the influence of the radiant lamps or low thermal mass heaters.

In a still further embodiment the isothermal preheating and post-cooling can be accomplished by direct electrical heating; i.e., by passing an electrical current through the substrate from end to end. High resistivity substrates such as undoped polycrystalline ribbons may require a start-up heating, for example by electron beam or radiant lamp, to a few hundred degrees to make the substrate sufficiently conductive. Heat treatment can be carried out as described above, with the direct isothermal heating and cooling used before and after the heat treatment, respectively.

Thus it is apparent that there has been provided, in accordance with the invention, method and apparatus for thermally treating semiconductor substrates. While the invention has been illustrated by reference to specific embodiments thereof it is not intended that the invention be so limited. Specifically, while the illustrative embodiments have related to an improved process for RTR recrystallization, it is intended that the invention also encompass other thermal treatments such as diffusion, oxidation, and the like of silicon and other semiconductor substrates. Other variations and modifications in the invention will appear to those skilled in the art after review of the foregoing detailed description. It is intended that all such variations and modifications be included within the scope of the appended claims.

We claim:

1. A process for converting polycrystalline material to macrocrystalline material comprising the steps of:
   isothermally heating said polycrystalline material to a first elevated temperature;
   further heating a localized portion of said polycrystalline material by an impinging energy beam to form molten material in a localized zone;
   causing said zone to traverse said polycrystalline material, and refreezing said molten material as macrocrystalline material as said zone passes; and
   isothermally cooling said macrocrystalline material to a second lower temperature.

2. The process of claim 1 wherein said step of isothermally heating comprises scanning said polycrystalline material with an energetic electron beam.

3. The process of claim 1 wherein said energy beam comprises a laser beam, ion beam, or an electron beam.

4. The process of claim 2 wherein said step of isothermally cooling comprises allowing said material to radiate to the surrounding ambient while scanning said material with an energetic electron beam.

5. The process of claim 1 wherein said step of isothermally heating comprises rapidly inserting said polycrystalline material into an isothermal region.

6. The process of claim 5 wherein said step of isothermally cooling comprises rapidly removing said macrocrystalline material from an isothermal region.

7. The process of claim 5 wherein said polycrystalline material is placed on a thermally conductive substrate.

8. A process for thermally treating a semiconductor substrate which comprises the steps of:
   further heating said substrate to a second temperature higher than said first elevated temperature for thermally treating said substrate; and
   isothermally cooling said substrate to a third temperature lower than said second temperature.

9. The process of claim 8 wherein said step of further heating further comprises diffusing said substrate.

10. The process of claim 8 wherein said step of further heating further comprises oxidizing said substrate.

11. A process for thermally treating a semiconductor substrate which comprises the steps of: isothermally heating said substrate to a first elevated termperature; locally heating said substrate to a second temperature higher than said first elevated temperature to create a localized molten zone; and isothermally cooling said substrate to a third temperature lower than said second temperature.

12. The process of claim 11 further comprising causing said molten zone to traverse said substrate.

* * * * *

UNITED STATES PATENT AND TRADEMARK OFFICE
CERTIFICATE OF CORRECTION

PATENT NO. : 4,547,256
DATED : October 15, 1985
INVENTOR(S) : GURTLER et al.

It is certified that error appears in the above-identified patent and that said Letters Patent is hereby corrected as shown below:

Column 8, claim 8, after line 10, before "further heating" insert --isothermally heating said substrate to a first elevated temperature;--

Signed and Sealed this

Twenty-second Day of July 1986

[SEAL]

Attest:

DONALD J. QUIGG

Attesting Officer

Commissioner of Patents and Trademarks